US006487112B1

(12) United States Patent
Wasshuber (10) Patent No.: US 6,487,112 B1
(45) Date of Patent: Nov. 26, 2002

(54) SINGLE-ELECTRON MEMORY (76) Inventor: Christoph Wasshuber, 4106 Springhill Estates Dr., Parker, TX (US) 75002

( * ) Notice: Subject to any disclaimer, the term of this patent is extended or adjusted under 35 U.S.C. 154(b) by 0 days.

(21) Appl. No.: 09/444,243

(22) Filed: Nov. 19, 1999

Related U.S. Application Data (63) Continuation-in-part of application No. PCT/AT98/00105, filed on Apr. 22, 1998.

(30) Foreign Application Priority Data

May 21, 1997 (AT) .............................................. 861/97

(51) Int. Cl.[7] .............................................. G11C 11/00
(52) U.S. Cl. ...................... 365/163; 365/161; 365/186
(58) Field of Search ............................... 365/163, 161, 365/186

(56) References Cited

U.S. PATENT DOCUMENTS

| 5,327,375 | A | * | 7/1994 | Harari ........................ 365/149 |
| 6,066,872 | A | * | 5/2000 | Okada et al. ................ 257/309 |
| 6,093,243 | A | * | 7/2000 | Okada et al. ................... 117/8 |
| 6,211,531 | B1 | * | 4/2001 | Nakazato et al. ............. 257/28 |

FOREIGN PATENT DOCUMENTS

| EP | 0642173 | 3/1995 |
| WO | 94 15340 | 8/1994 |
| WO | 98/53504 | 11/1998 |

OTHER PUBLICATIONS

M. Burghard et al.; Formation of gold particles at a functional LB film/gold interface leading to coulomb blockade phenomena; 1998 Elsevier Science S.A., Synthetic Metals 94 (1998) pp. 141–144.

Anri Nakajima et al.; Coulomb blockade in Sb nanocrystals formed in thin, thermally grown SiO2 layers by low–energy ion implantation; 1998 American Institute of Physics, Applied Physics Letters, vol. 73, No. 8, pp. 1071–1073.

D.L. Peng et al.; Characteristic tunnel–type conductivity and magnetoresistance in a CoO–coated monodispersive Co cluster assembly; 1999 American Institute of Physics, Applied Physics Letters, vol. 74, No. 1, pp. 76–78.

C. Vieu et al.; Coulomb blockade devices fabricated by liquid metal ion source droplet deposition; 1998 American Vacuum Society, J. Vac. Sci. Technol. B 16(6), Nov./Dec. 1998, pp. 3789–3794.

E. Bar–Sadeh et al.; Single–electron tunneling effects in granular metal films; 1994 The american Physical Society, Physical Review B, vol. 50, No. 12 pp.8961–8964.

M.C. Petty; Langmuir–Blodgett Films: Progress in Molecular Electronics Device Research.

* cited by examiner

*Primary Examiner*—Richard Elms
*Assistant Examiner*—Tuan T. Nguyen (57) ABSTRACT

A memory device in which each cell includes two portions of isolated-granular material: one portion forms the channel of a single-electron transistor, and the other provides a hysteretic I-V relationship in the gate circuit of the transistor.

20 Claims, 5 Drawing Sheets

SINGLE-ELECTRON MEMORY

CROSS-REFERENCE TO OTHER APPLICATION

This application claims priority as a continuation-in-part of PCT application PCT/AT98/00105 filed Apr. 22 1998 and published as WO 98/53504, and therethrough from Austrian application A861/97 filed May 21 1997, both of which are hereby incorporated by reference.

BACKGROUND AND SUMMARY OF THE INVENTION

The present application relates to memory structures which exploit the hysteretic and single-electron-gated conduction properties of isolated-granular films.

In the last twenty years integrated circuits have become continuously smaller and faster, and they consume less power per device. As further development of the well established CMOS technology starts to reach its limits, more and more new technologies are being suggested which promise to continue the trend to smaller, faster, lower-power, and cheaper. Among these new technologies, single-electronics is particularly interesting. An introduction to single-electron devices can be found in the article by Konstantin Likharev and Tord Claeson, 'Single Electronics', Scientific American, Jun. 1992, p. 50–55, which is hereby incorporated by reference.

Single-electron devices and circuits include islands (electric conducting regions such as quantum dots, metal grains and metal stripes) which are separated by tunnel barriers (potential barriers such as oxide). Additionally capacitors, resistors and voltage sources are incorporated. Islands (quantum dots) can only be charged or discharged by tunneling through potential barriers or thermionic emission over potential barriers. Such a charging can be suppressed by the so called Coulomb blockade, particularly if tunnel junction and island are very small. The Coulomb blockade together with tunneling allows the controlled transfer of single electrons between quantum dots (islands). This is also the reason for the name 'single-electronics'. The Coulomb blockade is the central physical effect which makes single-electronics possible. A number of devices (e.g. transistors, memories, logic gates, pumps, electrometers, among others) and manufacturing methods relating to this technology have been published or patented: see for example PCT and EPC applications WO94/15340, EP0642173A1, EP0727820A1, EP0675546A2, EP0718894A2, EP0750353A2, WO96/16448, and EP0649174A1, all of which are hereby incorporated by reference.

Crucial for an industrial success of single-electronics is operation at room temperature, manufacturability with established, economical, and reproducible methods, immunity to unavoidable manufacturing tolerances, and immunity to upset by random background charges. All devices so far published violate one or more of the above stated requirements (room temperature operation, simple mass fabrication, and immunity to random background charges).

To achieve a room temperature operation with such conventional devices, one would need to produce structures smaller than 10 nm. Fabrication tools for mass-producing such small structures are not available today. Unavoidable impurities introduce random background charges which can possibly suppress the Coulomb blockade entirely and thus break the desired operation of single-electron devices and circuits.

Immunity to random background charges is a particularly important requirement, since any semiconductor structure will have a certain density of free carriers at room temperature, any real semiconductor interface will have a certain density of traps, and any real environment will have a certain flux of ionizing radiation. The sensitivity which allows the device to respond to a single electron will also allow it to be affected, undesirably, by random charges.

Single-Electron Memory

This application describes a single-electron memory device which is immune to random background charges, works at room temperature, and is mass manufacturable with established and tested methods.

The disclosed devices use at least two isolated-granular films which are capacitively coupled. It solves all three above mentioned requirements for a digital memory element in a simple manner. A grain size below 10 nm is achieved by employing naturally formed granular films, particularly isolated-granular metal or semiconductor films, which are used in thin film structures. The size and shape of these films, rather than the individual grain, can then further be defined by well established lithography methods (optical lithography, e-beam) or any future method (SCALPEL, x-ray, ion-beam, near field, etc.). The smallest entity is thus not anymore the individual grain or tunnel barrier, but an isolated-granular film consisting of several nanoscopic grains and tunnel barriers. Since isolated-granular films can be produced with grain sizes down to 1 nm or less, the room temperature operation is ensured. And since there is no need to define individual quantum dots lithographically (they form naturally) there is no need for not yet established and available nanolithographic manufacturing tools. Thus patterning methods with minimum structures around 100 nm or even coarser are good enough for a successful production of the inventions described in this application. Additionally, employing isolated-granular films rather than individual quantum dots introduces a beneficial averaging effect which reduces the sensitivity to random background charges of this device. Background charges which disturb an individual island or a small part of the isolated-granular film do not necessarily have to disrupt the whole isolated-granular film. Hence the inventions described in this application can deal much better with impurities and errors introduced during manufacturing.

Further, this memory device can be read by Coulomb oscillations, as will be described later in more detail, which is insensitive to random background charges. This further reduces susceptibility to random background charges. The fact that the inventions described in this application employs isolated-granular films introduces therefore a strong resistance against random background charges which are caused by impurities and manufacturing errors.

A second reading mechanism exists where the IV-characteristic of one isolated-granular film changes depending on the charge stored in the device.

In contrast to the structures according to patent EP 0 642 173 A1 and EP 0 727 820 A1, where in one granular film storage and readout happens, the inventions described in this application has separated storage and readout structurally. This allows a separate optimization of the part which stores charges (information) and the one which reads it out. This means that the granular film responsible for storage and the granular film responsible for readout could be manufactured from two different materials and could be processed with two different process steps.

The properties of the isolated-granular film responsible for storage could be adjusted so that a nonvolatile memory device is achieved. This requires in particular high resistive isolated-granular films.

As already mentioned, the thin isolated-granular films in the inventions described in this application could be produced, for example, by evaporation or epitaxial growth methods followed by lithographic steps. Beside evaporation onto a substrate, one could also incorporate isolated-granular films into semiconducting structures, which is a well known technique today.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment (by way of example, and not of limitation).

Figure 1:
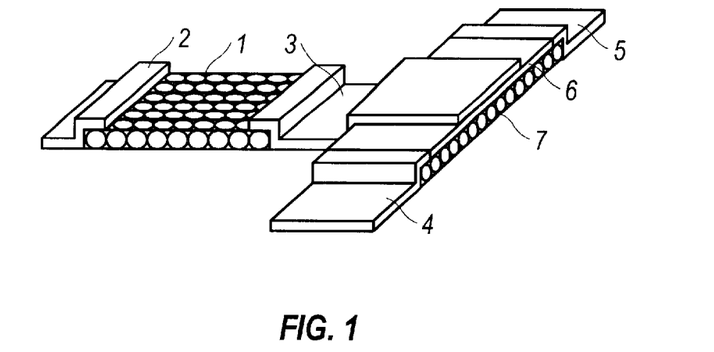
FIG. 1 depicts a memory device with two isolated-granular films coupled through a floating gate.

FIG. 1 depicts a memory device with an isolated-granular film 1, which is used to store charges or prevent them from escaping, and an electrode 2. Electrode 3 capacitively couples film 1 to isolated-granular film 7, which itself is connected to electrodes 4 and 5. Electrode 3 and isolated-granular film 7 are separated by insulating layer 6. The two isolated-granular films 1 and 7 can be produced in established ways (compare for example with EP 727 820 A1, which is hereby incorporated by reference). Their structure is explained in more detail in FIG. 4 and FIG. 5.

In this class of embodiments, the two isolated-granular films are preferably separate parts of a single thin-film layer. This is advantageous in that the processing steps required for preparation of an isolated-granular film are only performed once.

Figure 2:
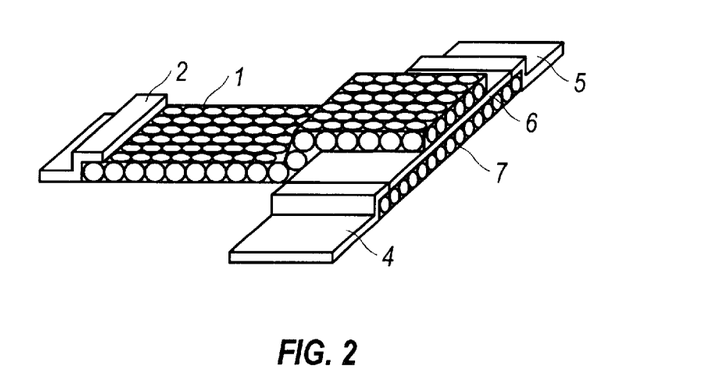
FIG. 2 shows a modified device embodiment, wherein two isolated-granular films are directly coupled through an insulator, without a floating gate.

FIG. 2 shows a modified variation. The individual parts are generally the same as depicted in FIG. 1, except that electrode 3 is missing. Isolated-granular films 1 and 7 overlap directly and thus provide a capacitive coupling (through an insulating layer).

Figure 3:
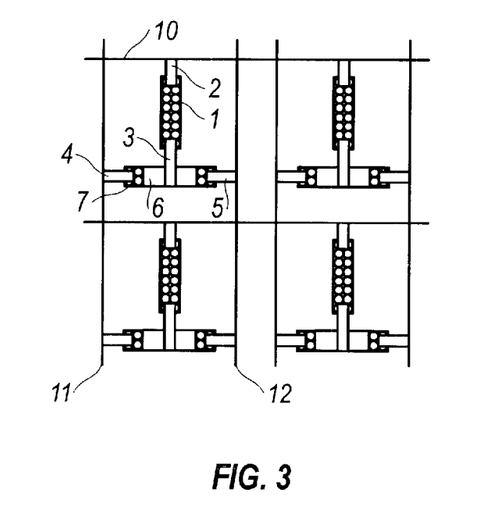
FIG. 3 shows a possible matrix configuration of bit-addressable memory devices like those of FIG. 1, FIG. 2, or alternative embodiments.

FIG. 3 shows a possible matrix configuration of bit-addressable memory devices. 10 is the word line, 11 is the +bitline and 12 is the −bitline. The bit-addressable single-electron memory device, with capacitively coupled isolated-granular films 1 and 7 and with electrodes 2, 4, and 5 allows a writing and reading as follows.

A negative voltage pulse on electrode 2, or a combination of a negative pulse on 2 and a positive pulse on 4 and 5, lets electrons tunnel through isolated-granular film 1 and accumulate in electrode 3 or in the overlap region of isolated-granular film 1 and 7. This is equivalent to writing a logic '1'. If the polarity of applied voltages is reversed, electrons will be removed from the storage electrode 3 or from the overlap region of isolated-granular film 1 and 7. This is equivalent to writing a logic '0'. The success of writing a '1' or '0' can be controlled by monitoring the current through isolated-granular film 7. If writing was not successful, the duration or amplitude of the writing voltages can be changed adaptively.

After writing, when all electrodes have reached again zero potential, a certain number of excess electrons will remain on electrode 3 or in the overlap region of isolated-granular film 1 and 7. The amount of stored electrons can be just one, or up to several thousand or million of electrons. How many electrons are actually stored depends both on the properties of the isolated-granular films and on the duration and amplitude of writing voltage pulses. In general one will try to store as few electrons as possible to keep power consumption to its minimum and speed to its maximum. However, in order to reduce error processes one will try to store more than one electron.

Depending on the material properties of isolated-granular film 1, one can adjust the storage time of electrons on electrode 3 (or the overlap region of film 1 and 7). Thermally activated electrons could escape from electrode 3 through isolated-granular film 1. Also by co-tunneling can electrons leave electrode 3. This can lead to losing the stored information. The storage time can be from few picoseconds up to several years. Thus one can turn it into a nonvolatile memory device. But even at short storage durations one could manufacture dynamic memories whose storage has to be periodically refreshed.

Reading the stored information could be accomplished in the following way. The stored charges on electrode 3 or in the overlap region of film 1 and 7 changes the IV-characteristic of film 7. That is a different current is observed depending if electrode 3 is charged or not. This is a nondestructive readout.

Figure 7:
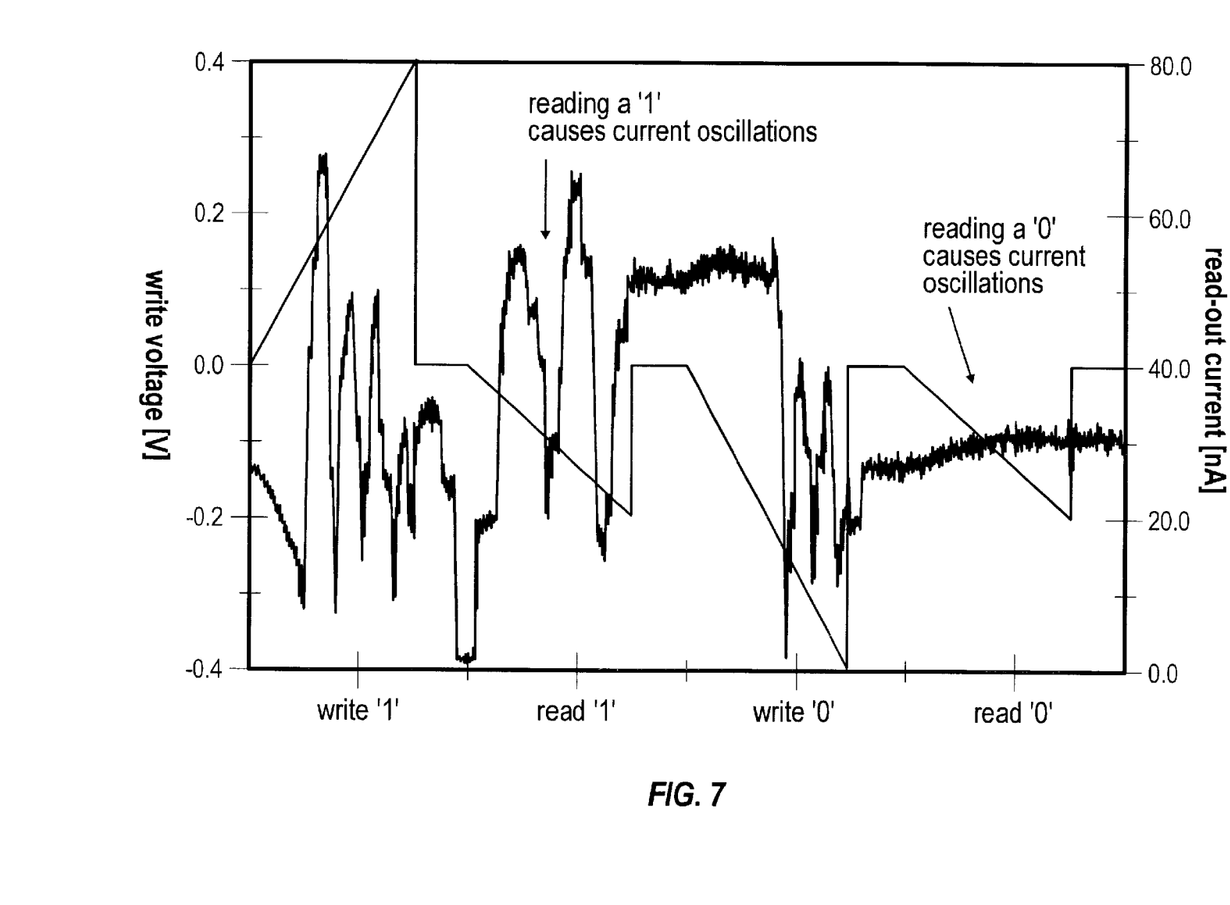
FIG. 7 illustrates the destructive readout mechanism using Coulomb oscillations.

A different readout mechanism is as follows. One applies the same voltage pulses on electrodes 2, 4, and 5 as when writing a logic '0'. Additionally one applies a small voltage difference between electrodes 4 and 5 (+bitline 11 and −bitline 12); that is, one writes a '0' into the device. At the same time, one measures the current flowing through film 7, and two cases can be distinguished. If the memory device already contained a '0' before writing another '0', the stored charge will not change. This will keep the current through isolated-granular film 7 unmodulated (unchanged). If however a '1' was stored before a '0' is written, charge has to be removed from electrode 3 or the overlap region of film 1 and 7. This will cause the current through film 7 to change periodically. This phenomenon is known as Coulomb oscillations. These oscillations are random background charge independent (only the phase is background charge dependent). Thus, the presence of current oscillations while writing a '0' determines if a '0' or '1' was stored. This method is a destructive readout. If a '1' was stored, one has to refresh the charge. FIG. 7 illustrates this readout mechanism. Shown are simulated results.

Figure 4:
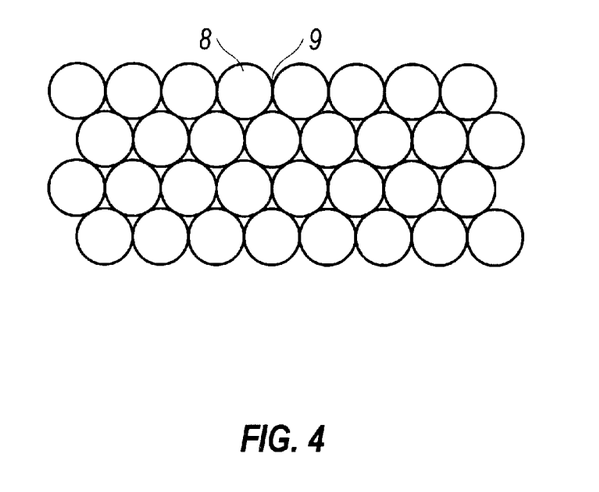
FIG. 4 schematically illustrates a simplified approximation to the microstructure of an isolated-granular film.

FIG. 4 depicts an isolated-granular film consisting of grains 8 and tunnel junctions 9. The actual arrangement of grains is not important and will in general not be uniform. Compare also to EP 727 820 A1 or EP 642 173 A1. Grains have to be made from conducting material (metal, semiconductor, conducting polymers, . . . ) and tunnel junctions can either be made from insulating materials (oxides of various kinds, nitrides, . . . ) or be potential barriers formed by depletion electrodes or otherwise naturally formed potential barriers.

Figure 5:
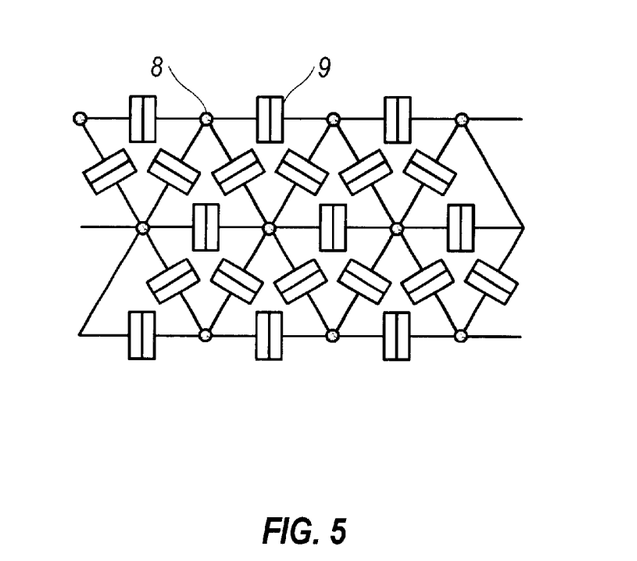
FIG. 5 shows the equivalent circuit of a piece of isolated-granular film.

FIG. 5 shows the equivalent circuit of a piece of isolated-granular film. 8 are the grains and 9 is the internationally used symbol for a tunnel junction. Here again, the precise connections of tunnel junctions is neither crucial (nor, in general, controllable) with current production processes.

Figure 6:
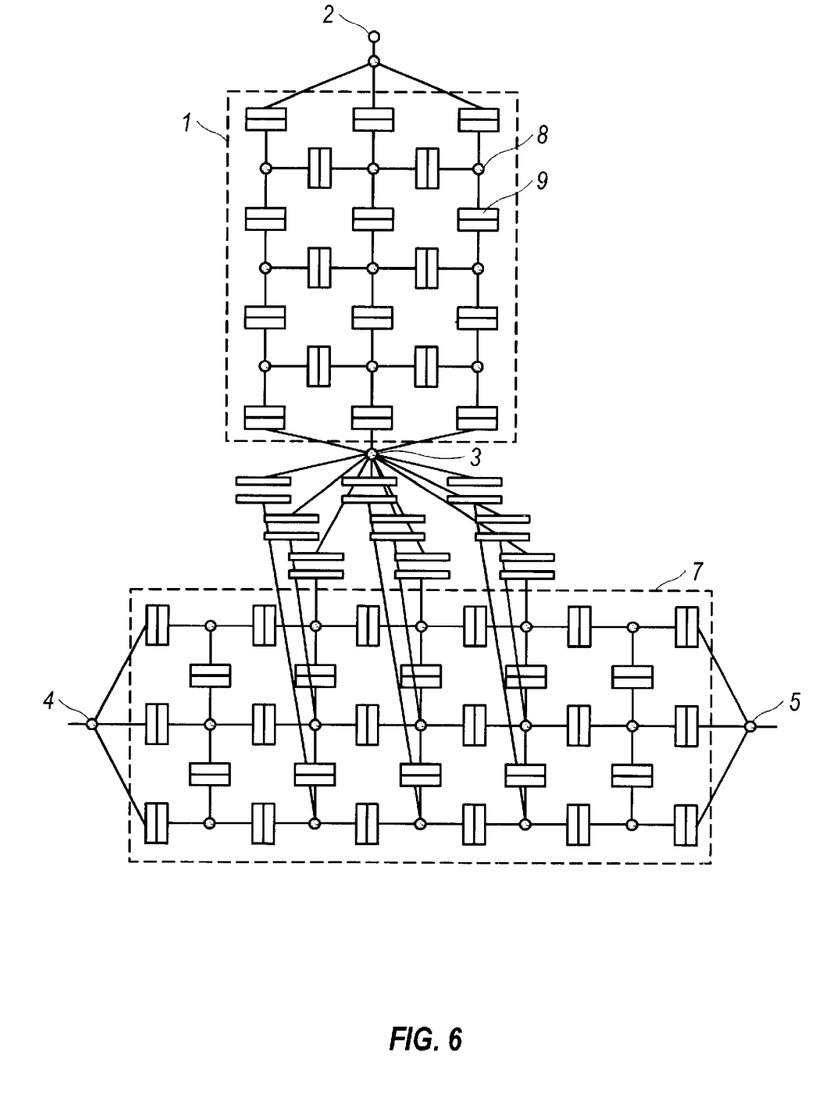
FIG. 6 shows the equivalent circuit of a memory device which includes two pieces of isolated-granular film.

FIG. 6 depicts the equivalent circuit of this memory device. The actual connections of grains in isolated-granular films 1 and 7 is arbitrary. Important for the correct function is the capacitive coupling of film 1 and film 7. Stray capacitances are not depicted.

FIG. 7 illustrates the destructive readout mechanism using Coulomb oscillations. This illustrates that reading the memory cell when a "1" was stored will result in Coulomb oscillations in thin film 7. If a "0" was stored, no oscillations will result in thin film 7 from the read. Since the readout is destructive, it must of course be followed by a writeback step to restore the data into the selected cell.

The material of films 1 and 7 is arbitrary, as long as conductive regions 8 are separated by not-conductive or less-conductive regions 9. The less-conductive regions are such that electrons can tunnel through, jumping from one quantum dot 8 to another. An isolated-granular film could be for example an oxide with metal grains embedded. In an alternative embodiment, metal granules are first covered with an isolating layer and then deposited on a substrate. For the granules themselves, semiconductors, or even organic materials can be used instead of metals. Many different manufacturing processes have been described in the literature. Fabrication of metallic granular films is described, for example, in: 'Formation of gold particles at a functional LB film/gold interface leading to Coulomb blockade phenomena', M. Burghard, G. Philipp, C. Mueller-Schwanneke, S. Roth, *SYNTHETIC METALS*, 94 (1998), 141–144; 'pH-gated single-electron tunneling in chemically modified gold nanoclusters', L. C.Brousseau, Q. Zhao, D. A. Schultz, D. L. Feldheim, *J. AM.CHEM.SOC.*, 120 (1998), 7645–7646; 'Fabrication and physics of ~2 nm islands for single electron devices', W. Chen, H. Ahmed, *J.VAC.SCI. TECHNOLOGY B*, 13 (1995), 2883–2887; 'Room-temperature Coulomb blockade dominated transport in gold nanocluster structures', L. Clarke et al., *SEMICOND- .SCI.TECHNOL.* 13 (1998), A111–A114; 'Coulomb blockade effect through a 2D ordered array of Pd islands obtained by colloidal deposition', C. Lebreton, C. Vieu, A. Pepin, M. Mejias, F. Carcenac, Y. Jin, H. Launois, *MICROELECTRONIC ENGINEERING*41/42 (1998), 507–510; all of which are hereby incorporated by reference.

Fabrication and behavior of semiconducting isolated-granular films (which are also suitable for use with the disclosed structure, and possibly even preferable) is described, for example, in: 'TSR quantum dots and their application to nanometer-size memory devices', Y. Sakuma, Y. Awano, M. Shima, FUJITSU *SCI.TECH.J.*, 34 (1998), 162–181; 'Construction of semiconductor nanoparticle layers on gold by self-assembly technique', T. Nakanishi, B. Ohtani, K. Uosaki, *JPN.J.APPL.PHYS.* 36 (1997), 4053–4056; 'Fabrication and electrical characteristics of single electron tunneling devices based on Si quantum dots prepared by plasma processing', A. Dutta, M. Kimura, Y. Honda, M. Otobe, A. Itoh, S. Oda, *JPN.J.APPL.PHYS.*, 36 (1997), 4038–4041; and 'Self-assembled Ge dots: growth, characterization, ordering, and applications', P. Schittenhelm et al., *J.VAC.SCI.TECHNOL.* B, 16 (1998), 1575–1581; all of which are hereby incorporated by reference.

The advantage of the inventions described in this application is their use of isolated-granular films which allows one to produce grains down to 1 nm diameter or less (which ensures room temperature operation). Further, the use of capacitively coupled isolated-granular films in contrast to single quantum dots reduces manufacturing requirements, since one does not have to resolve the single grain and tunnel junction lithographically. The dimension of isolated-granular films can be orders of magnitude larger than the dimensions of individual grains. The use of many grains per isolated-granular film averages the characteristics of individual grains, and thus provide a better immunity against background charges. Using Coulomb oscillations for readout further reduces sensitivity to random background charges.

Figure 8:
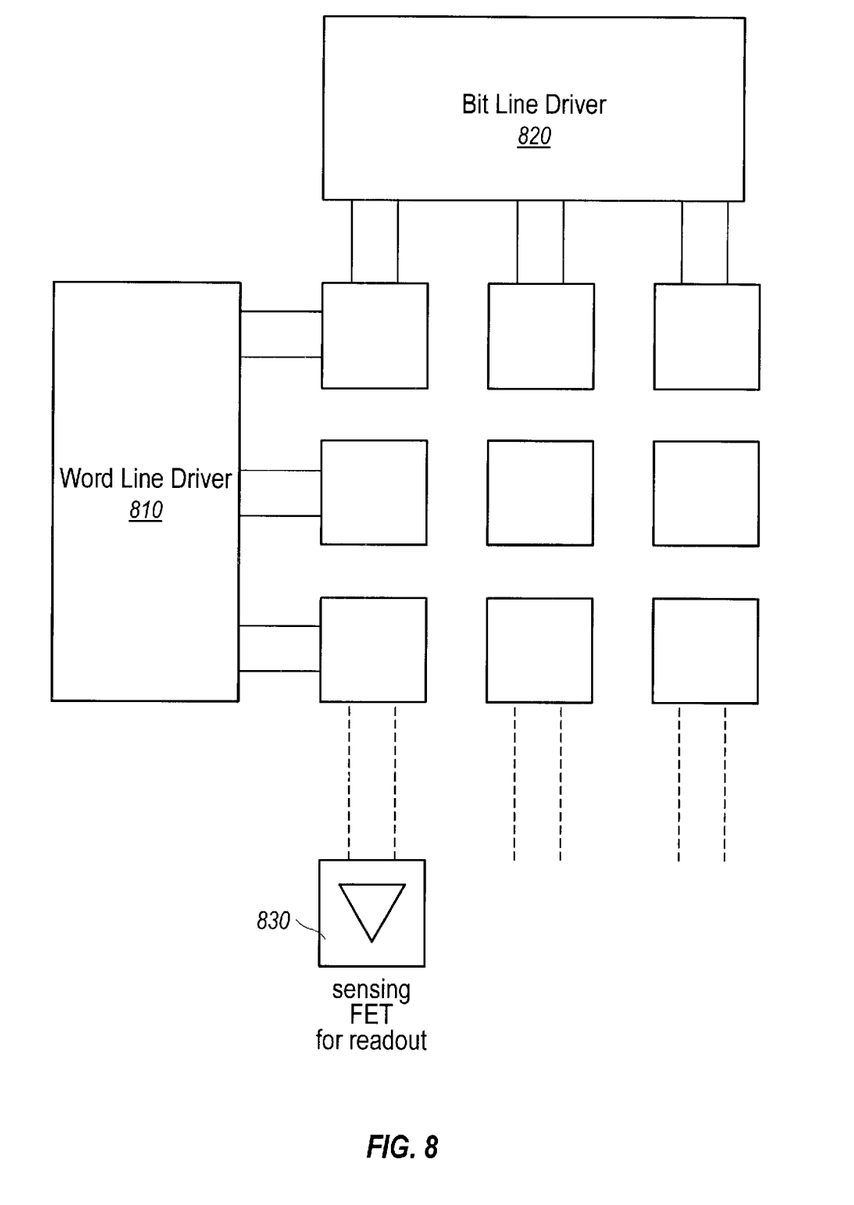
FIG. 8 schematically shows the interconnection of the memory cells with the peripheral read and write circuits.

FIG. 8 schematically shows the interconnection of the memory cells with the peripheral read and write circuits. The implementation shown includes three connections to each cell.

A word-line driver circuit 810 applies drive to the gate circuits of the cells in a selected row, and a bit-line driver circuit 820 biases the source and drain terminals of cells in a selected column.

During a write operation the word-line driver circuit 810 drives the gate circuits of the selected row in one direction (high, for example), and the bit-line driver circuit 820 drives the source and drain terminals of cells in the selected column in the opposite direction (low, for example).

The simplest implementation of the write operation is to bias both bitline terminals equally. However, in an alternative embodiment a bias voltage can be applied between the two members of the active bitline pair, so that completed writing can be seen by Coulomb oscillations and/or by interspersing read operations with write pulses.

During a read operation the selected cell a gate-source bias is similarly applied to the selected cell. The bit-line driver circuit 820 also applies a differential bias across the two bitlines of the selected column, and the read circuitry 830 detects the signal swing due to current in the selected cell.

As shown in the simulation of FIG. 7, the Coulomb oscillation will cause a distinctive data-dependent signature in the detected bitline voltage. Since the bias voltage is ramped (as also shown in FIG. 7), the Coulomb oscillation will also appear as an AC signal at the detector stage. The read circuitry can therefore be optimized for detection of this AC signal, and is preferably a DC-isolated differential amplifier.

As will be recognized by those of ordinary skill in the art of nonvolatile memory peripherals, other biasing arrangements can be used instead, compatibly with the device physics described above.

Definitions:

Following are short definitions of the usual meanings of some of the technical terms which are used in the present application. (However, those of ordinary skill will recognize whether the context requires a different meaning.) Additional definitions can be found in the standard technical dictionaries and journals.

Amorphous: A material in which there are no crystalline portions.

Bandgap: The range of energies which is normally unavailable to carriers in an undoped semiconductor. For example, the bandgap of germanium is about two-thirds of a electron Volt (eV), that of silicon is slightly more than one eV, and that of gallium arsenide is slightly less than 1 ½ eV.

Bipolar Transistor: A type of transistor in which current flow between emitter and collector diffusions is controlled by current at a base diffusion.

Carrier: In a semiconductor, an electron or hole, which can move around in the semiconductor material to transport charge. The movement of carriers is how electrical current flows.

Depletion: Reduction of carrier density, in a volume of semiconductor material, due to applied voltage.

Diffusion: The process of diffusion is the spontaneous movement of dopant or impurity atoms through a semiconductor, at a rate which depends on temperature and on the particular elements involved. The noun "diffusion" usually refers to a doped portion of a semiconductor material.

Diffusion Barrier: A material in which impurities have a low diffusion constant. For example, titanium nitride is often used as a conductive diffusion barrier material in silicon integrated circuit technology.

Diode: A two-terminal device.

Dopant: An atom added to a semiconductor, which, when activated, provides a "carrier" (i.e. an electron or hole) which can move around in the semiconductor to enable the flow of current. For example, in silicon technology, boron or gallium can act as P-type dopants (or "acceptors"), and phosphorus, arsenic, or antimony can act as N-type dopants (or "donors").

Drain: In a field-effect transistor, the diffusion to which majority carriers are emitted. For example, in an NMOS transistor, the drain will often be found connected to the more negative supply voltage (e.g. ground). In a PMOS transistor, the source will often be found connected to a positive power supply voltage.

Field-Effect Transistor (FET): A three-terminal device in which current between two current-carrying electrodes ("Source" and "drain") is controlled by the voltage applied to a "gate" terminal.

Gate: In a field-effect transistor, the electrode to which a control voltage is applied to modulate the conduction of the transistor.

Grain Boundary: An interface between separate grains in a polycrystalline material. The grain boundaries often have conduction and diffusion properties which are very different from those in the grains' interiors.

Hysteresis: The history-dependence of a property, e.g. of magnetism in a hard ferromagnetic material, or of polarization in a ferroelectric.

Junction: An interface between p-type and n-type semiconductor material.

Metallic: A material which has excess carriers, and hence is conductive. The term "metallic" may be applied to conductive materials (such as doped polysilicon or titanium nitride) which are not metals.

Metallization: In integrated circuits, a patterned wiring layer, which usually does not include transistor gates. Several independent metallization layers are typically used.

MOSFET: An insulated-gate field effect transistor, in which the gate is separated from the channel by a thin layer of an insulating material.

N-channel: A channel of n-type semiconductor material induced in a FET as a result of a bias applied to the gate. This channel allows current to flow from the drain to the source of an NMOS transistor. Typically an N-type channel is formed by surface inversion of p-type material, but it may also be formed by surface enhancement of n-type material.

NMOS: An n-channel field effect transistor, or a circuit or chip containing this type of transistor.

Nonvolatile memory: A memory in which the stored data will remain for a very long time, even if the power, supply is disconnected. Common types include EPROM, EEPROM, Flash, and battery-backed CMOS modules.

N-type: A volume of semiconductor which normally includes an excess of electrons. This can be achieved by introduction of "donor" dopants (such as phosphorus, arsenic, or antimony in silicon).

P-channel: A channel of p-type semiconductor material induced in a FET as a result of a bias applied to the gate. This channel allows carriers to flow from the source to the drain of a PMOS transistor.

P-type: A volume of semiconductor which normally includes an excess of holes. This can be achieved by introduction of "acceptor" dopants (such as boron or gallium in silicon).

PMOS: A p-channel field effect transistor, or a circuit or chip containing this type of transistor.

Polycrystalline: A material which is neither monocrystalline nor amorphous, but instead includes monocrystalline grains separated by grain boundaries.

Polysilicon: Polycrystalline silicon.

Resistivity: A measure of the resistance of a given material. Units are ohms times length.

Schottky Diode: A diode formed by a metal semiconductor interface.

Semiconductor: A material which is less conductive than a metallic material, but more conductive than an insulator. (More precisely, a semiconductor will have a nonzero "bandgap" between its valence and conduction bands, which is no more than a few electron volts at the very most.) The most frequently used semiconductor material is silicon, but there are many others, including e.g. gallium arsenide (or "GaAs"), silicon-germanium, mercury cadmium telluride, indium phosphide, gallium-indium arsenide-phosphide, lead tin telluride, diamond, and silicon carbide.

Sheet Resistance: The resistance of a square resistor, made from a given thin-film material, which has contacts on two opposite sides.

SOI: Silicon on insulator device. These devices have a steeper sub-threshold slope than conventional bulk devices, thus reducing off-state current without increasing Vt.

Source: In a field-effect transistor, the diffusion from which majority carriers are emitted. For example, in an NMOS transistor, the source will often be found connected to the more negative supply voltage (e.g. ground). In a PMOS transistor, the source will often be found connected to a positive power supply voltage.

SRAM: A static random-access memory, i.e. a memory in which the stored data will remain as long as power is applied.

TFT: A thin film transistor, in which the channel is made of a polycrystalline (rather than monocrystalline) material.

Threshold Voltage: The voltage at which a transistor starts to turn on.

Volatile memory: A memory in which the stored data will quickly evaporate if the power supply is disconnected. Common types include DRAM and SRAM.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

Preferably the two isolated-granular films are capacitively coupled by a storage electrode which collects charges which tunnel through one isolated-granular film and which is isolated by an oxide layer from the second isolated-granular film. However, in one contemplated class of alternative embodiments, it is also possible to directly overlap both isolated-granular films without the storage electrode in between. The isolating film between first and second isolated-granular film stays, but the net advantage of this alternative is expected to be a more compact device.

In another contemplated class of alternative embodiments, it is also possible to introduce a floating electrode, separated by an insulating layer from first and second isolated-granular film, between the isolated-granular films. The capacitive coupling is then achieved by two capacitors in series.

It is also possible to reduce isolated-granular films to isolated-granular one-dimensional quantum wires, or even single quantum-dots. In a further variation of this embodiment, it is also contemplated that the capacitive coupling between the two isolated-granular portions can also be achieved in-plane if both isolated-granular films, wires, or dots are positioned side by side (or interleaved).

In another contemplated (and less preferred) class of alternative embodiments, the write and read processes can be performed with higher resolution, to store more than one bit of data) per cell. This is however a further refinement, which is preferably not incorporated in first-generation devices.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

What is claimed is:

1. A memory device structure consisting of:

a transistor; and a gate connection to said transistor in which a first isolated-granular structure, consisting of tunnel junctions and of grains made from conducting material, is interposed as a series conduction element;

said transistor having a second isolated-granular structure, consisting of tunnel junctions and of grains made from conducting material, as a channel thereof;

whereby the hysteretic state of said first isolated-granular structure stores data which is detectable through said transistor's performance.

2. The device structure of claim 1, wherein both said isolated-granular structures are formed from a single thin film layer.

3. The device structure of claim 1, further comprising a storage electrode which provides capacitive coupling between said first and second isolated-granular structures.

4. The device structure of claim 1, wherein said first and second isolated-granular structures overlap to provide capacitive coupling therebetween.

5. The device structure of claim 1, wherein at least one of said isolated-granular structures consists of a substantially one-dimensional isolated-granular wire.

6. A memory structure, comprising a transistor;

a gate connection to said transistor in which a first isolated-granular structure, consisting of tunnel junctions and of grains made from conducting material, is interposed as a series conduction element;

said transistor having a second isolated-granular structure, consisting of tunnel junctions and of grains made from conducting material, as a channel thereof;

circuitry which controllably drives said first isolated-granular structure to store data therein; and circuitry which controllably detects the conduction characteristics of said transistor, to thereby detect the hysteretic state of said first isolated-granular structure.

7. The memory structure of claim 6, wherein both said isolated-granular structures are formed from a single thin film layer.

8. The memory structure of claim 6, further comprising a storage electrode which provides capacitive coupling between said isolated-granular structures.

9. The memory structure of claim 6, wherein said first and second isolated-granular structures overlap to provide capacitive coupling therebetween.

10. The memory structure of claim 6, wherein at least one of said isolated-granular films consists of a substantially one-dimensional isolated-granular wire.

11. The memory structure of claim 6, further comprising circuitry which detects the stored data by detecting the presence or absence of current oscillations in the characteristics of said transistor.

12. The memory structure of claim 6, further comprising circuitry which detects the stored data by observing the I-V characteristics of said transistor.

13. The memory structure of claim 6, further comprising an array of memory cells, each including one said transistor and one said gate connection.

14. A method for nonvolatile data storage, comprising the actions of:

selectably storing data, by driving a first isolated-granular structure, consisting of tunnel junctions and of grains made from conducting material, to induce hysteretic behavior; and selectably reading data, by monitoring the characteristics of a transistor whose channel is formed in a second isolated-granular structure consisting of tunnel junctions and of grains made from conducting material, and which is gated by a potential which is at least partly dependent on the state of said first structure.

15. The method of claim 14, wherein both said isolated-granular structures are formed from a single thin film layer.

16. The method of claim 14, wherein said isolated-granular structures are coupled through a floating storage electrode.

17. The method of claim 14, wherein said isolated-granular structures overlap, at an insulated location, to provide capacitive coupling therebetween.

18. The method of claim 14, wherein said first and second isolated-granular structures are each contained in every one of a plurality of cells in an array, and said storing and reading steps are performed on selected ones of said cells.

19. The method of claim 14, wherein said reading step is performed by further comprising circuitry which detects the stored data by detecting the presence or absence of current oscillations.

20. The method of claim 14, further comprising circuitry which detects the stored data by observing the I-V characteristics of said second matrix.

* * * * *